United States Patent
Bittenson et al.

[19]

[11] Patent Number: 6,030,506
[45] Date of Patent: Feb. 29, 2000

[54] PREPARATION OF INDEPENDENTLY GENERATED HIGHLY REACTIVE CHEMICAL SPECIES

[75] Inventors: Steven Bittenson, Bedford; Frederick Becker, Reading, both of Mass.; Ronald Breault, Newington, N.H.

[73] Assignee: Thermo Power Corporation, Waltham, Mass.

[21] Appl. No.: 08/931,738

[22] Filed: Sep. 16, 1997

Related U.S. Application Data

[60] Provisional application No. 60/026,153, Sep. 20, 1996.

[51] Int. Cl.[7] .................................................. H05F 3/00
[52] U.S. Cl. ............................................................. 204/164
[58] Field of Search ....................... 204/164; 422/186.04, 422/186.21; 588/227

[56] References Cited

U.S. PATENT DOCUMENTS

| | | |
|---|---|---|
| 3,981,815 | 9/1976 | Taniguchi et al. . |
| 3,997,415 | 12/1976 | Machi et al. . |
| 4,004,995 | 1/1977 | Machi et al. . |
| 4,324,759 | 4/1982 | Aoki et al. . |
| 4,351,810 | 9/1982 | Martinez et al. . |
| 4,507,265 | 3/1985 | Higo et al. . |
| 4,525,142 | 6/1985 | Gleason et al. . |
| 4,584,465 | 4/1986 | Mathisson et al. . |
| 4,585,631 | 4/1986 | Pfeiffer . |
| 4,595,569 | 6/1986 | Reuter et al. . |
| 4,596,642 | 6/1986 | Higo et al. . |
| 4,686,022 | 8/1987 | Rempt . |
| 4,882,020 | 11/1989 | Maezawa et al. . |
| 4,915,916 | 4/1990 | Ito et al. . |
| 4,943,356 | 7/1990 | Dietrich . |
| 4,952,231 | 8/1990 | Kaneko et al. . |
| 4,954,320 | 9/1990 | Birmingthan et al. . |
| 4,961,830 | 10/1990 | Aoki et al. . |
| 4,969,984 | 11/1990 | Kawamura et al. . |
| 4,975,572 | 12/1990 | Rempt . |
| 5,004,587 | 4/1991 | Tacchi . |
| 5,015,443 | 5/1991 | Ito et al. . |
| 5,020,457 | 6/1991 | Mathur et al. . |
| 5,041,271 | 8/1991 | Aoki et al. . |
| 5,089,098 | 2/1992 | Tacchi . |
| 5,102,516 | 4/1992 | Rempt . |
| 5,104,634 | 4/1992 | Calcote ................................... 423/446 |
| 5,236,672 | 8/1993 | Nunez et al. ...................... 422/186.04 |
| 5,244,552 | 9/1993 | Namba et al. . |
| 5,256,265 | 10/1993 | Cha . |
| 5,269,892 | 12/1993 | Cha . |
| 5,356,672 | 10/1994 | Schmitt, III et al. .................... 427/446 |
| 5,357,291 | 10/1994 | Schonberg et al. . |
| 5,362,451 | 11/1994 | Cha . |
| 5,378,898 | 1/1995 | Schonberg et al. . |
| 5,397,444 | 3/1995 | Zimek et al. . |
| 5,458,748 | 10/1995 | Breault . |
| 5,490,973 | 2/1996 | Grothaus et al. .................. 422/186.04 |
| 5,526,641 | 6/1996 | Sekar et al. . |
| 5,547,651 | 8/1996 | Rolfe . |
| 5,591,412 | 1/1997 | Jones et al. ............................. 422/171 |
| 5,635,059 | 6/1997 | Johnson .................................. 210/192 |

*Primary Examiner*—Donald R. Valentine
*Assistant Examiner*—Wesley A. Nicolas
*Attorney, Agent, or Firm*—Lorusso & Loud

[57] ABSTRACT

This invention concerns a method and apparatus for delivery of exogenous non-thermal plasma activated species to a subject fluid comprising (a) creating activated species in an energizing means; and, (b) introducing said activated species into a subject fluid by high speed injection means.

9 Claims, 9 Drawing Sheets

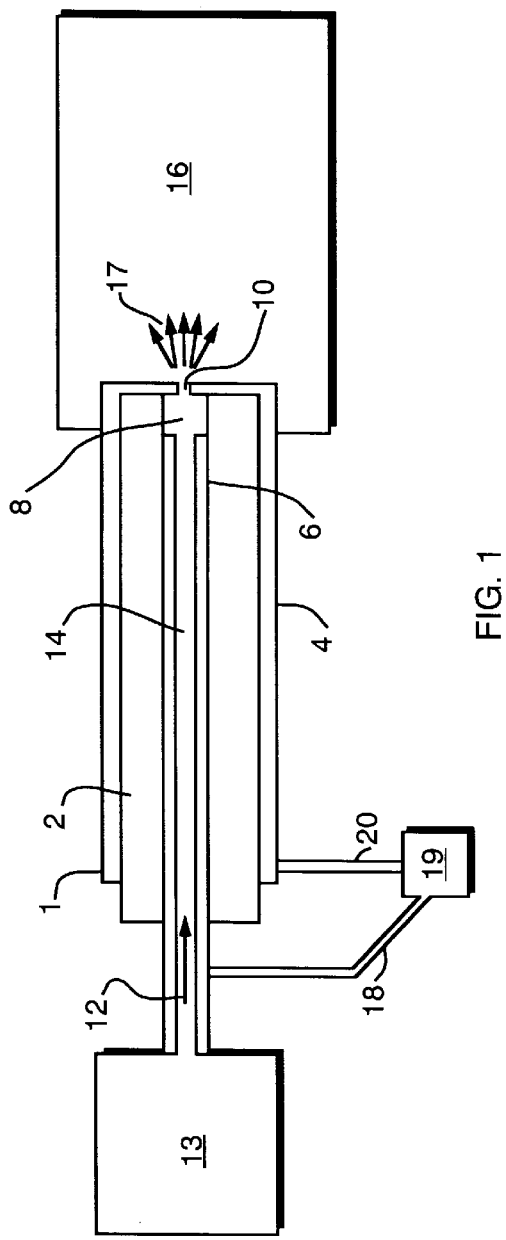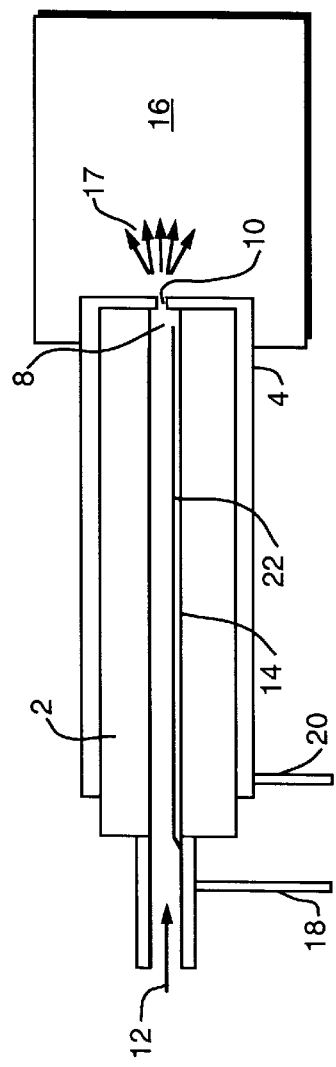

6,030,506

PREPARATION OF INDEPENDENTLY GENERATED HIGHLY REACTIVE CHEMICAL SPECIES

RELATED APPLICATIONS

This application claims priority from Provisional Application 60/026,153 filed Sep. 20, 1996.

FIELD OF THE INVENTION

This invention concerns a method and apparatus for delivery of exogenous non-thermal plasma activated species to a subject fluid comprising (a) creating activated species in an energizing means; and, (b) introducing said activated species into a subject fluid by high speed injection means.

BACKGROUND

This invention addresses air pollution control as well as an apparatus and method of performing large scale chemistry for bleaching, enhancing chemical reactions, and pollution removal. Extensive research is being done worldwide to develop new, commercially viable methods for removing undesirable chemical species from air or from exhaust gases such as combustion exhausts, contaminated liquids, such as industrial process effluents, or biologically contaminated water, and contaminated surfaces. Among the approaches to addressing these needs are technologies employing electrical excitation of a gas phase. The principal technologies include excitation by thermal, reactive chemical/catalytic, and non-thermal electric discharge and electron beam techniques. Commercial applications in some of these technologies have been developed, but there is considerable room for advancement. The same excitation techniques used in pollution remediation or control may also be applied to chemical processing or synthesis.

Among the technical disadvantages of existing approaches the following are noted. Thermal approaches alone are non-selective, and require large amounts of energy. Reactive chemical/catalytic approaches require purchased chemical reagents. For example, if ammonia is used as a reagent for the reduction of $NO_x$ in combustion exhaust, its use must be carefully monitored to avoid ammonia release, which could result in a secondary pollution problem. In catalytic methods, pollutants themselves or other chemical species or particulates contaminate and inactivate catalysts. Solid catalysts in particular become fouled and require replacement or regeneration. Non-thermal electric discharge/electron beam technologies directly excite all exposed species and, under particular conditions, are not adequately selective to modify the target contaminants in a useful manner. For example, in the single step removal of $NO_x$ from flue gas, nitric oxide in flue gas is rapidly converted into nitrogen and oxygen (desirable products) by nitrogen atoms generated in an electric discharge. However it is also rapidly converted into nitrogen dioxide or nitric acid and other oxidized species (undesirable products) by hydroxyl radicals in the same discharge. The nitric acid then requires additional treatment (e.g., chemical scrubbing) to remove it from the exhaust stream. In this example, achieving a single step NO removal process requires more control of the flue gas chemistry than is available by direct excitation of the flue gas. In some applications of control discharge technology, flue gases foul electrodes, which then require electrode cleaning or replacement. Further, the dielectric properties of materials used in barrier-type discharges are temperature dependent and thus add complexity to the design of such reactors used with the temperatures present in flue gas.

SUMMARY OF THE INVENTION

The present invention entails a method of delivery of exogenous non-thermal plasma activated species to a subject fluid comprising (a) creating activated species in an energizing means; and, (b) introducing said activated species into a subject fluid by high speed injection means. In some embodiments the introducing of activated species is in less than about 10 milliseconds, and particularly in less than about 5 milliseconds or less, and more particularly in less than about 1 millisecond, and less than about 0.1 milliseconds. In some embodiments at least about 50% of activated species created in step (a) is delivered to said subject fluid, and in certain embodiments at least about 10% of activated species created is delivered in less than about 10 milliseconds to said subject fluid. It is particularly noted that introducing of activated species to the subject fluid is within about 10 mm or less, 5 mm or less, 3 mm or less and 2 mm or less from the point of creating said activated species represent useful configurations.

Optionally, the method also comprises the step of engaging at least about 10% of said activated species in target reactions in the subject fluid. Furthermore, introducing of activated species at an operating pressure differential above the subject fluid of from about 5 to about 50 psid (pounds per square inch differential) is noted, with specific reference to an operating pressure differential is at least about 15 psid. While a number of temperature ranges are disclosed introducing activated species at temperatures up to about 600° C., and particularly less than about 450° C., less than about 250° C. and less than about 100° C. are noted. Introduction of activated species at rates from about 10 to about 400 meters/second are disclosed with particular reference to at least about 100 meters/second as well as at least about 50 ft/second.

The claimed method also includes introducing of activated species as being unidirectional introducing and absent retrograde introducing of subject fluid into said high speed injection means, particularly in situations where back flow or retrograde flow is a consideration such as when the jet is immersed in liquid.

The claimed method further includes creating of activated species is by subjecting a flowing gas to passage between two electrodes which, in combination, comprise a self switching high-voltage electrode.

In other embodiments the invention includes an apparatus for delivery of exogenous non-thermal plasma activated species to a subject fluid comprising energizing means in high speed fluid connection with the subject fluid via high speed injection means, and particularly unidirectional high speed injection. In particular unidirectional embodiments, the directional aspect is enabled by a check valve, or by removal of said high speed injection means from contact with subject fluid. In some apparatus configurations the energizing means provides up to about 750 joules/liter, or up to about 1000 joules/liter, to an exogenous fluid to be activated to said exogenous non-thermal plasma activated species, and in particular embodiments the injection means is a slot or circular jet aperture (e.g., about 0.2 to about 5 mm in width, and particularly about 0.2 to about 1 mm).

In a particular apparatus wherein the high speed injection means comprises a body, and that body comprises a high dielectric insulating tube having a front end nearer to a reaction chamber and a rear end away from the reaction chamber, and the high speed injection means has a front exit port in fluid connection with said reaction chamber, and wherein within the high dielectric insulating tube is a high voltage electrode extending toward, but not fully to, the exit port of the high speed injection means the apparatus further comprises a ground return shield and electrode at the front of the high dielectric insulating tube, and the space between the end of the high voltage electrode and the front of the jet comprising an electric discharge volume in fluid connection with the reaction chamber wherein said electric discharge to reaction chamber distance is 10 mm or less. In such embodiment, optionally, the high speed fluid connection with the subject fluid via high speed injection means further comprises a closure means.

BRIEF DESCRIPTION OF THE DRAWINGS

FIG. 1 is an enlarged cross-sectional view of particular high speed injection means, here a needle style jet, for activated species injection, including side and jet output end views.

FIG. 1a is the variation on the design in FIG. 1 including a wire or point high voltage electrode instead of a tubular electrode.

DETAILED DESCRIPTION OF THE INVENTION

Figure 2A:
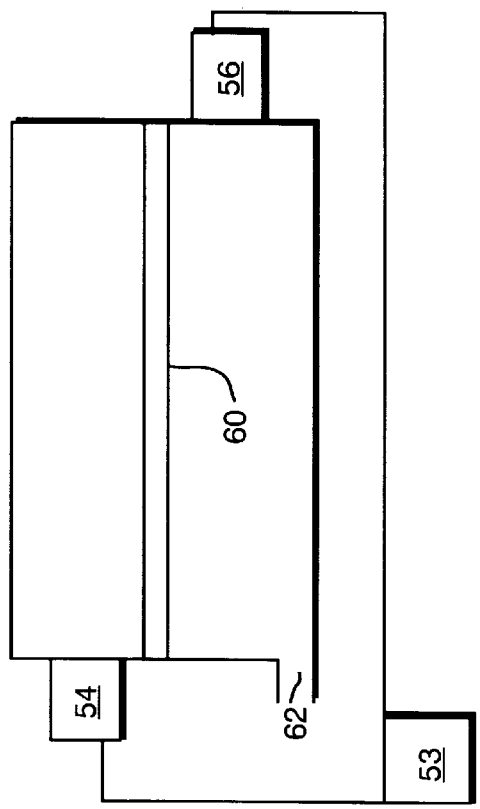
FIG. 2a is an external, jet output end view of the apparatus of FIG. 2.

This invention is best understood with reference to the following definitions:

A. "Activated species" are chemical entities not naturally occurring in useful concentrations in a gas at a given working temperature in the absence of an activation mechanism such as an electric discharge or an electron beam. Active species are designated by "•" as in N• for active nitrogen (atomic nitrogen in this case). By "not naturally occurring in useful concentrations" it is meant that, absent a specific mean s for generation of activated species, insufficient activated species is present to perform a significant number of "desired reactions" (see below) to reduce pollutants by more than about 1% of the concentration of such pollutants absent such generation.

Energies of activation per atom or molecule producing the activated species typically are in the range of approximately 0.1 electron volt (eV) to approximately 10 eV. For clarity, unless otherwise stated, eV references electron volts per activation or per molecule activated. Activation occurs through a variety of mechanisms including mechanisms involving direct electron collisions, or secondary or later collisions, light absorption, and via molecular processes involving ionization or internal excitation. Excitation to create an activated chemical species typically requires 0.3 to 10 eV.

Particular reference is made to monatomic nitrogen (N•) and monatomic oxygen (O•) as activated species. Other activated species may include but are not restricted to the following and their charged (ionic) analogs: OH•, $H_2O$•, SH•, $CH_3$•, other hydrocarbon species. $O_3$ is noted as constituting a less reactive activated species.

In the practice of the present invention, the practice of introducing activated species into the reactor by a piping or channeling means is severely restricted by a limiting time factor of up to about 50, or preferably about 20, or more preferably about 10 milliseconds. As noted below, at a flow rate of about 300 m/second, a flow path of longer than about 3 m substantially compromises the ration of activated species delivered. Thus, high speed injection as defined below is required. Furthermore, if subsonic speeds of injection are to be maintained, injection by multi-orifice pipe (from a single source of excitation) is largely precluded. In such situation, the loss of activated species prior to injection outweighs any increase in mixing obtained by multi-orifice injection. Structurally, it is a corollary of this physical limitation that the requirement of generation of activated species for sub-50, and particularly sub-20, and sub-10 millisecond delivery to the gas stream precludes interpolation of a multichannel flow directing system. In particular embodiments the distance between the electric discharge zone and the reaction chamber is 10 mm or less, and particularly 5 mm or less and most particularly 2 mm or less.

In the case of $NO_x$ chemical reduction, ozone is less acutely active as a reactant. Ozone, of course, is generally considered a pollutant if it constitutes a portion of a process effluent. The half-life of ozone is about 1 second at 400° F., and about 1 minute at 200° F. In particular embodiments of the present invention, "acutely reactive" activated aspecies are employed. Such "acutely reactive" activated species will be understood to be those with a half-life of about 80% or shorter of the half-life of ozone.

The example of atomic nitrogen upon jet injection illustrates elements of both activated species and acutely reactive activated species. The characteristic deactivation (recombination) of atomic nitrogen (No) to molecular nitrogen ($N_2$) in near ambient temperature air (about 65°–75° F.) is approximately 1 to 5 milliseconds beginning at concentrations of about 1000 ppm N). In a particular embodiment wherein the N• is generated 1 mm upstream of a jet exit aperture, and the injection velocity is 100 meters/sec, less than 1% of the N• is deactivated before injection. After injection, contacting of the No bearing jet stream with the subject fluid (including, e.g. NO) within 1 to 5 milliseconds from the creation of the activated species maintains efficient chemical reduction within the subject fluid, here, with particular reference to NO reduction. The reaction of No with NO in combustion exhaust is typically from about 10 to about 1000 times faster than the recombination of N• and N• to $N_2$. This ratio is, however, influenced by temperature and relative concentrations. Nevertheless, efficient mixing of activated species with subject fluid is an 34t important factor in process efficacy. In the process and apparatus of the instant invention, mixing withing a travel of about 10 cm from jet opening to the point of entry into subject fluid is optimizing.

In particular embodiments of the present invention, such as bleaching, the presence of ozone is of substantially greater import than in other applications in which ozone will comprise a component of lesser significance—ozone-insensitive applications—wherein vibrationally and/or electronically excited molecular oxygen, atomic oxygen, (and some ultraviolet light) as active species from the jet, will be of primary concern. A conventional ozone generator does not provide these other short lived species. It is noted that the present invention will produce activated oxygen that reacts with molecular oxygen to, secondarily, produce ozone.

In other specific embodiments, particular activated species and combinations of activated species can be sequentially introduced into the subject fluid. This can be accomplished by a variety of methods. One such method is to change the composition of gas flowing into a jet to skew the composition of activated species. Another, and not exclusive, methodology is to place jets injecting the desired species increasingly "down stream" in a flowing subject fluid.

B. "Desired Reactions" (as distinguished from "target reactions" below) are reactions accomplishing the purpose for which activated species are introduced into a specific fluid. In some $NO_x$ removal applications this is a chemical reduction reaction, based largely on generation of reducing activated species such as N• In bleaching applications, for example, oxidation is the desired reaction, based largely on the generation of oxidizing activated species such as O•.

C. "Energizing" shall mean imparting to a molecular moiety at least about 0.1 eV above the normal energy state (i.e., "ground state") to create activated species.

D. "Energizing means" shall be the source of energy for energizing molecular moieties, and shall include control discharge, arcs, radio discharges such as microwaves, non-thermal plasma discharges, radioactive sources, and light (including lasers). Typically energizing means will impart from about a few electron volts, often on average about 5–10 eV (such as a control discharge apparatus), up to hundreds of kilo electron volts (such as by electron beam excitation or e-beam) which provides electron energies in the range from about 10 keV (kilo electron volt) to about 1 MeV (mega electron volt). A delivered energy of from about 0.1 to about 10 eV is generally required to create an activated specie.

E. "Exogenous" shall reference a source of molecules and moieties to become activated species other than the specific molecules and moieties of the subject fluid being treated by activated species. By way of example, a combustion exhaust stream is treated by activated species generated from an exogenous source wherein the source is ambient air, compressed nitrogen or compressed oxygen which is then subjected to an energizing means.

It is to be understood, however, that the subject fluid can, upon treatment, provide a source of "exogenous" molecules and moieties. One primary activated species is atomic nitrogen, and subject fluid can be a source of nitrogen. In one embodiment of such treatment, the subject fluid—a gas—is mixed with additional fuel and burned to remove remaining oxygen. Then the gas is dried to remove water. The remaining constituents are primarily nitrogen and carbon dioxide, which are excited to produce the active species. In particular applications, the economics of this process are better than purchasing nitrogen or separating it from air. As a general description, this treatment of subject fluid to provide exogenous species for activation is the chemical modification of subject fluid before excitation for injection. In one example, a portion of the flue gas is used as chemical feedstock for a process which generates the appropriate reagent mixture for excitation and injection.

F. "Fluid-external system" refers to a system not in fluid communication with a subject fluid except by injection means. This means that only external air (or other fluid) is being activated for injection. In defining the fluid-external system it is understood that while the injection means comprises a port into the exhaust system, the system will be termed external.

G. "High Dielectric" refers to a dielectric constant approximately of about 4 up to $TiO_2$ or $ZrO_2$ of 80 or beyond. It is noted that alumina, zirconia, magnesia or a titanate (e.g. calcium, zinc or barium), and optionally including $TiO_2$ are high dielectrics.

H. "High speed injection" shall be understood to be a relative term predicated on the life span of an activated species from its creation. High speed injection will be understood to mean a speed of injection sufficient to transport the activated species beyond the injection means and into potential contact within subject fluid where the target reaction(s) is to occur, and before a substantially total retrograde reaction(s) occurs. In particular embodiments of the present invention, the quantity of activated species brought into potential contact with the desired reactants in the subject fluid are from about one to about five times the stoichiometrically required amount for complete reaction. In one embodiment, at least 5% of the activated species is brought into "potential contact" with the subject fluid where the target reactions are planned, and in particular embodiments at least about 10%, 20%, 30%, 40%, and 50%. By way of example, it is noted that N• has a half-life is less than about 10 milliseconds at atmospheric pressure in air at normal room ambient temperature (about 65°–75° F.). When flow through an injection means is about 300 m/sec, activated species are injected into subject fluid when the point of generation is within less than about 3 m from the end of the injection means where it is inserted into the fluid. In preferred is embodiments, the transport of activated species will not exceed one foot, or as otherwise limited by the physics of gas jet formation in the subject fluid with particular reference to the half-lives of activated species.

Clearly, an energizing means located within millimeters of the end of the injection means, which then offers a short time for delivery of activated species to the subject fluid, is advantageous. Additionally, increasing the rate of transport of activated species through an injection means will also be advantageous to deliver of more activated species to a subject fluid and increase potential contact. However, specific speeds contemplated as "high speed" include jet exit gas velocities of about 10 m/second up to about 400 m/second are contemplated.

I. "Injection means" shall mean an apparatus for generation of highly reactive or activated species, as well as the conduit or means by which such activated species are introduced into a subject fluid, such as into a subject fluid stream. The injection port through which the activated species ultimately flows into the subject fluid can be of a variety of shapes including nozzles or elongate slits bearing straight or curved apertures.

The angle of entry of injection relative to the flow of subject fluid in a subject fluid stream is particularly noted. While injection at right angles is noted, other angles of entry and types of nozzles are specifically contemplated. It is understood that factors such as viscosity, flow rate, temperature, pressure, turbulence, Newtonian fluid considerations, and other factors will effect the optimizing of introduction of activated species into a subject fluid.

The process of optimizing the production and injection of activated species into a subject fluid typically will consist of both numerical modeling and experimental parameterization. The numerical modeling includes calculated production of activated species as a function of excitation conditions, temperature and chemical composition of the subject fluid, gas pressures, injection velocities and geometry, mixing dynamics, and chemical kinetics calculations of the desired and competing reactions. The experimental optimization includes measured chemical reaction (desirable and undesirable) as a function of position downstream of injection, excitation conditions in the jets, temperature and chemical composition of the subject fluid, gas pressures, injection velocities and geometry. It is to be understood that gas jets may further include the electrical properties and electrical means of a diode. In the case of a continuously flowing process subject fluid, optimization will include measurement of the extent of chemical reactions as a function of position (time) downstream of the injection point(s).

Analysis of post-reaction subject fluid such as by gas spectroscopy is useful in determining residual pollutant composition, and the efficacy of reaction condition adjustments.

In particular applications, it is important that injection be unidirectional and absent retrograde introducing of subject fluid into said high speed injection means. This is particularly important in methods directed to injection into liquids such as paper pulp slurry. Maintenance of unidirectional flow and the exclusion of retrograde flow is accomplished by a variety of means. In one embodiment the injection means is simply maintained at a positive pressure differential as to the subject fluid—even if no activated species are being generated. In another, the injection means port is closed or covered over. In particular embodiments, the injection means is separated from the subject fluid. Separation is accomplished variously by such means as removing the injection means from the subject fluid, by the step of withdrawing the apparatus for creating activated species from the subject fluid, or—in the case of a liquid subject fluid, by withdrawing, repositioning, or reducing the level of subject fluid from the conduit or chamber in which the subject fluid is contained or flowing J. "Non-thermal plasma" shall mean low temperature non-equilibrium concentrations of activated species as determined relative to their concentrations at ambient temperature. Plasma shall mean a partly or completely ionized gas.

A gas as a whole is partially ionized if a fraction of the gas molecules in it are ionized. Partly ionized is used in reference to a particular molecule or atom if the discussion concerns, for example, how many electrons have been removed from that molecule or atom. By way of example, helium has a total of 2 electrons when electrically neutral. If one looks at doubly ionized helium $He^{++}$, then at $He^+$ is termed partly ionized. ($He^{++}$ is also called an alpha particle).

By way of example, at 50° C., free nitrogen is virtually totally in the ground electronic and vibrational state of $N_2$ and not in the N• monatomic state. A plasma in which N• exists at about 450° C. or less is a non-thermal plasma. Energizing $N_2$ to cause an increased N•:$N_2$ ratio is an example of the creation of a non-thermal plasma. Thermal dissociation of $N_2$ to N• is insignificant except at temperatures above about 4000 K.

The following is an estimate of the energy efficiency of a non-thermal plasma generated active species injection process. In this example the process is directed to NO removal by chemical reduction of NO with N• in combustion exhaust gas. Other processes are similarly analyzed. This is intended as one example, and not the only process to be addressed by the jet injection technique.

It is estimated that the practical efficiency of converting energy delivered to a nitrogen (non-thermal) plasma into nitrogen dissociation or other useful active species to be approximately 70%. Thus for 100 watts electrical power dissipated by the non-thermal plasma source, approximately 70 watts contribute to breaking the chemical bonds in diatomic nitrogen gas to form N•. In some applications, a practical activation processes has a higher or much lower efficiency than shown in this example, with a probable range of between about 10% to 90% conversion of energy delivered to the plasma into useful excitation.

One advantage of a particular activation process is its economics in view of the presence or absence of commercially competitive processes.

A practical efficiency of delivering N• to the combustion exhaust before it undergoes recombination or other undesirable reactions is estimated to be 60%, so approximately 6 of every ten N• formed reaches the flue gas for reaction. The efficiency of delivering other activated species to the combustion exhaust will depend on the lifetime of the activated species under the operating conditions of the system, and the delivery speed and geometry.

It is estimated from kinetic modeling calculations that to react completely with a given concentration of NO in exhaust gas, the optimum injected, volume averaged concentration of N• is approximately 1.5 to 3 times the initial NO concentration. Thus, for an exhaust NO concentration of 100 ppm, N• should be delivered to and mixed with the exhaust gas to provide an effective concentration of approximately 150 ppm to 300 ppm. One nitrogen dissociation can yield two N•, so between 0.75 and 1.5 times the amount of NO is needed of nitrogen molecular dissociations. In addition to the operating range in this example, it is in some situations useful to react with only a fraction of the target reactant in the subject fluid. If, for example, the $NO_x$ concentration need only be reduced by 20% (e.g. to reach regulatory compliance for the exhaust stream), N• in the amount of 0.15 to 0.3 times the amount of NO in the exhaust stream is required.

A commonly used energy reference for calculating the efficiency of removing NO is the energy required to dissociate NO into N• and O•(~7.5 eV). Based on this criterion, the input of 7.5 eV per NO molecule removed would constitute 100% efficiency.

From the above estimates, the overall energy efficiency of process is on the order of 46%, requiring approximately 17 eV per NO molecule removed by chemical reduction. Although higher overall efficiencies are generally desirable, it is estimated that efficiencies as low as less than approximately 1% may be useful for some processes. Laboratory measurements to date have demonstrated efficiencies of this process to up to approximately 10%.

Based on 46% overall efficiency, an exhaust gas flow of 1000 scfm (standard cubic feet/minute) containing 100 ppm NO would require approximately 3 kW of electrical power delivered to the jets to completely react the NO.

It will be particularly understood that No, or 0 between about 5° C. and 450° C., and particularly below about 300° C., and particularly in the range of about 250° C. to about 5° C., and more particularly about 100° to about 30° C. are low temperatures as regarding a non-thermal plasma.

K. "$NO_x$" shall mean any oxide of nitrogen, including, but not limited to, NO, $N_2O$, $NO_2$, $N_2O_5$, $N_2O_3$, $NO_3$.

L. Potential contact shall mean that the activated species is in a reactive proximity with the subject fluid. By reactive proximity is meant that activated species are present in the subject fluid such that, in some instances, target reactions can occur.

M. "Reduction Promoting" and "Oxidation Promoting" are reciprocal concepts. N•—absent other activated species—favors reduction. OH. and O• favor oxidation. In the example of removing NO from combustion exhaust, we refer to the overall reaction to form $O_2+N_2$ as chemical reduction, and to form $NO_2$ (or acid) as oxidation.

Depending on the application, Reduction Promoting or Oxidation Promoting will be the more useful reaction. It is contemplated that the composition of the exogenous gas is adjusted to provide a bias in the proportion of activated species which favor oxidation or reduction. For example, in some embodiments the exogenous gas consists of substantially pure nitrogen, or in another embodiment, water saturated $O_2$. Conditions arising from the use of substantially pure diatomic nitrogen will favor reduction while those with water saturated $O_2$ will favor oxidation.

N. "Retrograde reaction" shall mean those reducing or destroying activated species prior to the entry of such species into the subject fluid. For example, if N• is the active species, two N• species recombining into a single $N_2$ molecule prior to the entry of the activated species into the fluid stream is a retrograde reaction. Similarly, if OH is the active specie, an OH• reacting with an H• to form $H_2O$ is a retrograde reaction. Dampening of a vibrationally energized moiety prior to its entry into a subject fluid is a retrograde reaction. Such reaction is termed substantially total if about 99% or more of the activated species revert to non-activated species prior to entry into the subject fluid. It is understood that such reactions can and will occur after injection into the subject fluid, but this is understood as not negating the opportunity for a target reaction in the subject fluid.

O. "$SO_x$" refers to oxides of sulfur including, $SO_2$, $H_2SO_4$, $H_2S$, $CH_3SH$, and $CH_3S_2CH_3$.

P. "Subject fluid" shall be expansively understood to mean a liquid or gas. It is understood that such subject fluid or gas will, in certain embodiments, contain volatilized compounds such as chlorocarbons, sulfur dioxide, nitrogen compounds, and hydrocarbons, and will, in some embodiments, contain particulates, and biological organisms, or transport activated species to solids such as catalytic surfaces where the target reactions are to occur. Examples of such particulates, catalytic surfaces, and organisms are, without limitation, soot, paper pulp fibers such as wood and cotton, vanadium pentoxide, zeolite, and bacteria. The foregoing is contained variously in internal combustion engine exhausts, flue gas, climate control air streams, water droplets within such air streams, reaction chambers, and liquid slurries. Subject fluid in motion is termed a subject fluid stream, but will not, unless explicitly stated, refer to the fluid carrying activated species from the point of generation to the subject fluid wherein the target reactions are to occur. It is to be understood that the target reactions need not be reactions on the treated fluid but, in fact, usually will occur as to materials entrained therein or on solid surfaces exposed to the subject fluid.

Q. "Substantially" in referring to the post-reaction form of $NO_x$ shall mean at least about 50%, and preferably at least about 80% of all $NO_x$ is converted to either $N_2$ or acid.

R. "Target reaction(s)" shall mean reactions between activated species and elements of the subject fluid, including particulates or compounds within said subject fluid, or entrained in a subject fluid stream. The term target reactions is expansively used and—while it encompasses "desired reactions"—it stands in contrast to the term "retrograde reactions." By way of amplification, reaction of activated species with $NO_x$ compounds altering the distribution of $NO_x$ compounds or reducing the presence of nitrogen oxides in an exhaust gas stream, or reaction of activated species with bacteria in a bactericidal process would be target reactions, and, in particular applications, the "desired" reaction. However, "side reactions" that are not necessarily the desired reactions, but are nevertheless reactions between elements within the subject fluid and not retrograde reactions are also to be understood to be target reactions. Thus two N• toms as delivered into the subject fluid, and therein recombining to $N_2$ represent a target reaction. This is an important consideration because the fact of delivery of activated species to the subject fluid represents the potential for desired reactions.

S. "Vibrationally activated" shall mean a species with at least about 0.1 eV of vibrational activation as exemplified by vibrationally activated diatomic nitrogen ($N_2$•) or oxygen ($O_2$•).

Energy Considerations

In the practice of this invention, attention is brought to the energy efficiency of a non-thermal plasma generated, activated species injection process. Consider the case of $NO_x$ removal wherein NO is the $NO_x$ species and N• is the agent of chemical reduction. The use of non-thermal plasma offers a particular advantage in the energy efficiency of the present invention. Temperatures below about 600° C., or preferably below about 450° C. and preferably below 250° C. and particularly in the range of about 100° C. to 15° C. are useful in the present invention.

It is to be understood that the non-thermal plasma generation temperature is independent of the presenting flue gas temperature. Energy is further saved in that high temperature gases are not required to maintain activity of the activated species until delivery to permit delivery of the activated species to a point where a target reaction can occur.

The practical efficiency of converting energy (e.g. electric discharge) to a nitrogen (non-thermal) plasma or other useful active species is approximately 70%. Thus, for 100 watts electrical power dissipated by a non-thermal plasma source, approximately 70 watts contribute to breaking the chemical bonds in diatomic nitrogen gas to form N•. The practical efficiency of delivering this N• to the combustion exhaust before it undergoes retrograde reaction such as recombination or other undesirable reactions is, in one embodiment, about 60%, so approximately six of every ten No formed reaches the flue gas for reaction. In some embodiments it is more convenient to express energy input as measured by input to the gas jet. In such instances, energy input up to about 750 joules/liter is effective.

Kinetic modeling reveals that to react completely with a given concentration of NO in exhaust gas, the optimum injected volume averaged concentration of No is approximately 1.5 to 3 times the initial NO concentration. Thus, for an exhaust gas NO concentration of 100 ppm, N• is delivered to, and mixed with, the exhaust gas to provide an effective concentration of approximately 150 ppm to 300 ppm. One diatomic nitrogen dissociation yields two No atoms. Therefore, $N_2$, via molecular dissociation to N• of between 0.75 and 1.5 times the amount of NO is preferred.

A useful energy reference for calculating the efficiency of removing NO is the energy required to dissociate NO into N• and O•, which is approximately 7.5 eV. Based on this criterion, the input of 7.5 eV per NO molecule removed would constitute 100% efficiency. From the above calculations, the overall energy efficiency of process is, in some embodiment, on the order of 46% relative to the dissociation energy of NO, and requiring approximately 17 eV per NO molecule removed by chemical reduction.

Laboratory measurements to date have demonstrated efficiencies of this process up to approximately 10%, but it is anticipated that about 46% is obtainable.

Based on 46% overall efficiency, an exhaust gas flow of 1000 scfm containing 100 ppm NO requires approximately 3 kW of electrical power delivered to the jets. In laboratory testing of $NO_x$ removal by oxidation or by chemical reduction, high voltage power was generated from 120 vac, 60 Hz line power using a 24000 volt, 5 kVA transformer. For tests at power frequencies other than 60 Hz, the line power was conditioned before the transformer using a Powertron 3000s or 350s is power amplifier manufactured by the Industrial Test Equipment Company(Port Washington, N.Y.), and a Circuitmate function generator FG2 (Beckman Industrial Corp., San Diego, Calf.) was used as a frequency source. Voltages were monitored using a Tektronix P6015 high voltage probe and Tektronix model 7633 oscilloscope (Beaverton, Oreg.). Many other well known electric discharge power sources are useful. It is anticipated that electron beam sources, especially sealed electron beam tubes such as those manufactured by AIT Corporation (Los Angeles, Calf.), are also useful as dissociation sources.

Chemical Specificity

Among the operating parameters which can affect the specificity of the excitation and subsequent chemical reaction processes are the chemical nature of the activated species, the temperature(s) at which injection and reaction occur, the timing of the introduction of the active species to the subject fluid, and the means of excitation producing the activated species. By way of example, removing NO from flue gas exemplifies several such points.

Chemical nature of the active species

Consider the activation of oxygen vs nitrogen gas for injection into flue gas containing NO. In the case of activation of oxygen to produce O•, the principal chemical reaction with NO in the subject gas produces $NO_2$. In the case of activation of nitrogen, the principal chemical reaction of N with NO in the subject gas produces $N_2+O•$.

Temperature

Consider the injection of N• into flue gas containing 100 ppm NO and also containing 10% O2. Both of these component concentrations are in the normal range for internal combustion engines. In this chemical environment at 25° C., the rate of the reaction of the injected N• with NO to produce $N_2+O•$ is approximately 300 times greater than the rate of reaction of the same N• with $O_2$ to produce NO+•. The first reaction represents a chemical reduction path, while the second reaction represents a chemical oxidation path, so chemical reduction is overwhelmingly the dominant process.

However, given the same gas composition at 630° C., the rate of the reaction of the injected N• with NO to produce $N_2+O•$ is approximately $\frac{1}{7}$ the rate of reaction of N• with $O_2$ to produce NO+O•. At this higher temperature, the oxidation path is the dominant process. In some embodiments, by controlling the temperature and composition of the subject fluid and the injected gas provides critical control of the chemical path.

Timing

Continuing with the example of N• injection, N• recombines rapidly to form $N_2$ at gas pressures exceeding a small fraction of a standard atmosphere, and at temperatures at least up to 700° C. At near atmospheric pressure, typical N• recombination times (assuming other chemical reactions have not depleted the supply of N) are on the order of 1 to 10 milliseconds in the collisional environment. For efficient use of atomic nitrogen as a reagent for a chemical reaction, delivery for reaction within less than approximately 10 milliseconds from its time of creation by an energizing source is indicated.

As a general statement on timing, the effective lifetime of the more useful activated species is from about 0.1 to about 10 milliseconds. Thus, useful injection times are from about 0.1 to about 10 milliseconds as measured from excitation to injection. Particular note is made of injections of less than 1 millisecond, and less than 0.1 milliseconds.

Factors affecting flow through the gas jet is a process consideration substantially intertwined with timing. Jet speeds of about 10 to 400 meters/second are useful with particular note of speeds of greater than about 50 meters/sec., as well as speeds of greater than about 150 meters/second. Operating pressure differentials for the flow emitted from the jet into the subject fluid wherein the pressure in the jet is greater by about 5 to about 50 psid are useful with note of a differential of at least about 15 psid. Expressed another way, a pressure differential wherein jet pressure is at least about twice the pressure of the subject fluid is noted. The foregoing factors are largely accommodated if the jet has a working pressure of between about 1 and 5 bar.

Means of excitation

Different means of excitation can result in different processes dominating the activation of species in the jet, and thereby the nature of the excitation. For example, a high energy electron beam contributes a larger fraction of its energy into nitrogen dissociation than will a corona discharge, whereas the corona discharge will contribute more of its energy to the vibrational excitation of molecular nitrogen than will the electron beam. The choice of corona discharge or electron beam can select for a dominant mode of activation, and thereby the reactions in the subject fluid.

It is also noted that electric discharges produce light, including ultraviolet light, in about the ultraviolet range (<400 nm). Ultraviolet light in particular instances induces chemical reactions. Depending on the requirements of the process, choosing the position of the excitation relative to the injection (and therefore the injection speed) will select whether the subject fluid is exposed to this light and therefore whether the associated chemical reactions will take place in the subject fluid. It is a characteristic of UV light that UV photons have energy sufficient to drive photochemical reactions, including dissociating water, and bleaching reactions. In particular embodiments wherein UV is generated, not by a conventional UV "lamp," but as a concomitant of the energy applied to the fluid of the fluid-external system, UV will both impinge upon the gas to be activated, as well as penetrate into the subject fluid through the opening which the gas jet comprises. Penetration into the subject fluid is enhanced by the absence of an intervening lamp housing which acts to filter out some or all UV light.

In summary, the combination of activated species, temperature control, injection speed, and means of excitation contribute to the selectivity of the chemical processes in the subject fluid.

It is an important aspect of this invention that activated species are delivered as activated species to the subject fluid subsequent to their exogenous generation from non-thermal plasma. In contrast, generation of activated species within the subject fluid compromises the chemical specificity of the present invention.

Process Considerations

In the case of chemical reduction of $NO_x$ by N•, care must be taken such that the non-thermal plasma does not generate significant quantities of $NO_x$. The activated species jet exits the jet mechanism, driven by the pressure differential between the discharge volume inside the jet and the subject fluid.

Note that typically the volumetric flow of jet gas for treating combustion exhaust (the subject fluid) is expected to be smaller than 5% of the volumetric flow of the exhaust. In the case of the chemical reduction of 100 ppm NO in exhaust gas, the theoretical minimum consumption of nitrogen gas will be 50 ppm, since each nitrogen molecule can yield two nitrogen atoms. Practical considerations of jet mechanics nd delivery temperature are expected to yield a minimum practical gaseous nitrogen consumption of approximately 100 times this figure, or 0.5% of the subject fluid flow.

Any source of gaseous nitrogen may be considered for this chemical reduction application. This could include air, exhaust gas, or other nitrogen bearing gas. These gases may be supplied directly to the jets for some applications. If nitrogen (or other gas) separation is required for a particular application, commercially available membrane, differential sorption, or chemical technologies may be applied to accomplish this.

As to oxygen species, particular attention is directed to control of the jet chemistry as achieved, in part, through control of the jet operating parameters. Using the production of O• for the oxidation of NO to $NO_2$ or for bleaching applications, it is noted that at a working pressure of 1 bar and a jet injection temperature of 230° C., the 50% recombination time of is atomic oxygen in a jet containing nitrogen and 1% oxygen is approximately 1 millisecond, for O• produced at a concentration of 0.5% in the jet. If the elapsed time from excitation to injection into the reaction volume is 0.01 milliseconds, then approximately 99% of the generated O• is available for mixing and reaction with the subject fluid. In this he principal chemical path for loss of O• is recombination to form $O_2$, with less than 5% of the O• chemically reacting with $O_2$ to form $O_3$ on the one millisecond time scale. If the production of $O_3$ is desired, 100% $O_2$ may be used as the jet gas, producing $O_3$ as a principal reaction product from O•+$O_2$ collisions before exiting the jet. Other transitional species present include electronically and/or vibrationally activated oxygen and ozone species.

The Apparatus

Figure 7:
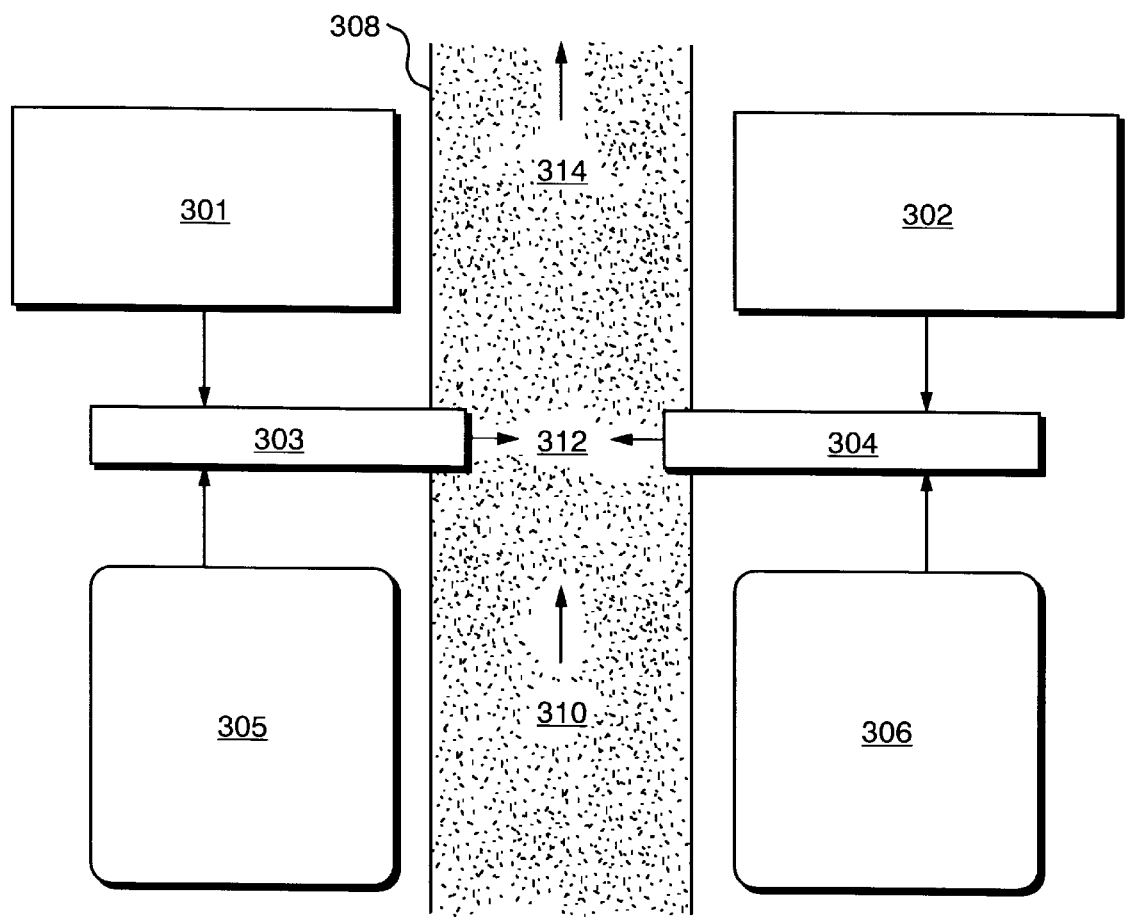
FIG. 7 is a diagrammatic representation of an apparatus for multiple activated species injection through independent jets for treatment of fluids.
Figure 8:
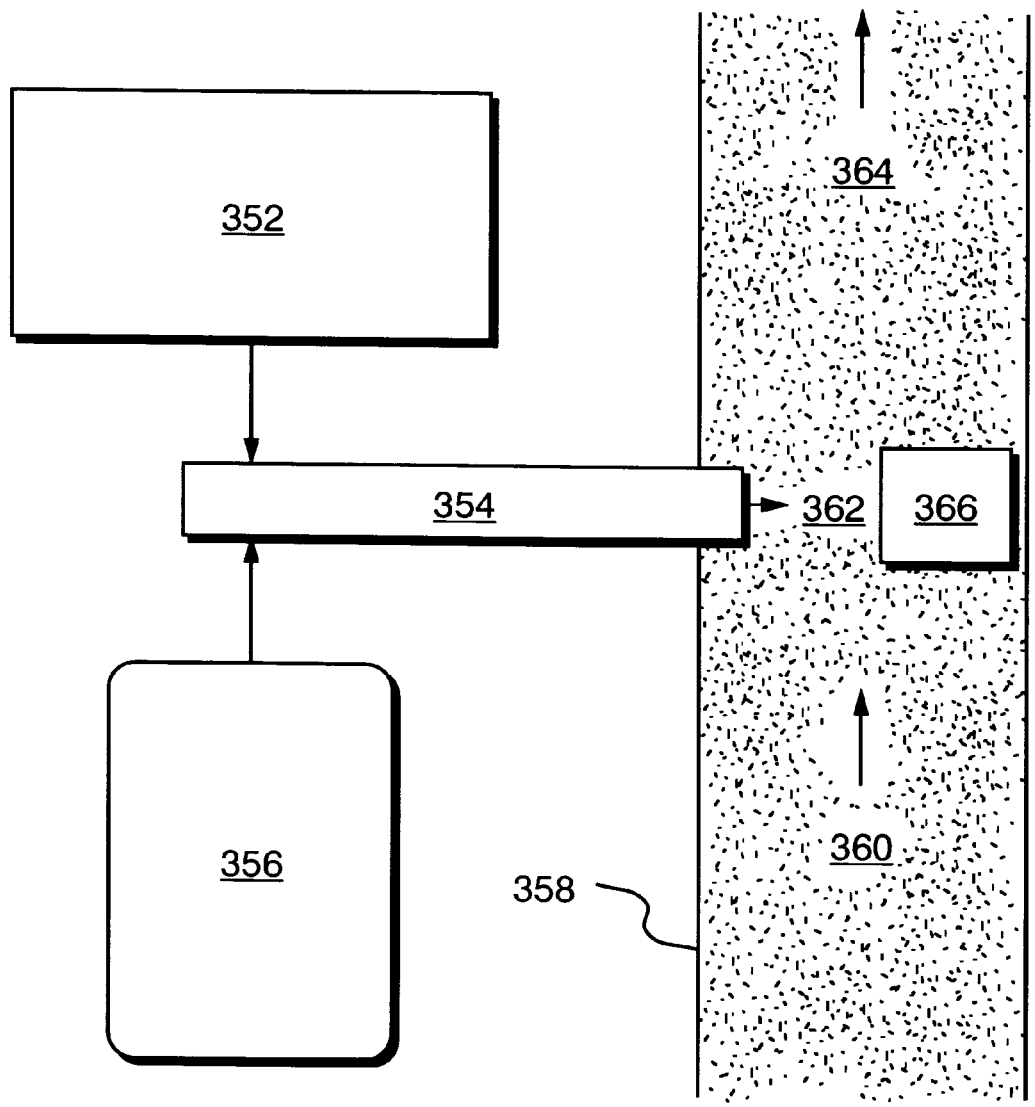
FIG. 8 is a diagrammatic representation of an apparatus for activated species injection for catalysis enhancement and surface treatment.

Two basic physical configurations of jets are presented. Other configurations will be apparent to those skilled in the art. One configuration is jets with holes such as those with injector needles (FIG. 6), and another configuration is slit construction in either a straight or curved configuration (FIG. 7 and FIG. 8). Typical operating conditions for a single needle jet is about 5 to 40 scfh flow of the working gas, about 3 to 30 watts of electric power dissipated in the jet, pressure head for the jet about 5 to 30 psig, outlet aperture of the jet 0.01 to 0.04 inches in diameter. The upper limit in diameter is determined by the mechanism of activation, and the transport time of the activated species from activation to reaction with the subject fluid. Larger diameter jets can generate greater amounts of activated species, but also in general increase the average time from activation to reaction, which reduces the efficiency of the process. Smaller diameter jets can provide locally better mixing in the subject fluid, but with decreased physical extent of penetration into the subject fluid of the jet. In the case of arrays of multiple closely spaced jets, it is estimated that aperture diameters as small as about 0.001 inch may be used, and for large installations, jets with exit apertures up to approximately 1 inch in diameter may be used.

Narrow slit aperture jets, in one embodiment, are formed by the close approach of parallel high dielectric tubes with internal electrodes. The internal electrodes of slit type jets were either centered or off-center (eccentric) within the high dielectric tubes (or partial tubes), depending on the experiment. Jets arrays were formed by an assembly of the slit type jets described above, with alternating polarity electrodes arranged into an annulus with the central contained volume forming a plenum for the gas being delivered to the jets. Six high dielectric tubes were assembled into a hexagonal cross section array of radially outward directed slit-type jets.

In another embodiment, the electrodes directly form the slit jet aperture, without dielectric tubes. In a third embodiment, the slit jet is curved rather than straight, forming an outward directed jet, an annular jet, or an inwardly directed jet, depending on details of the physical design.

Electric power for the jets is provided by any number of sources. Both low or high frequency AC high voltage (60 Hz to 6000 Hz) with open circuit voltages up to 30 kV are useful. Among possible discharge sources are high voltage (typically >5 kV) DC or AC (e.g. 60 Hz to radio frequency), microwave radiation (particularly for slit jets incorporating high dielectric barriers), electron beam sources (e.g. modular units in about the 20–100 keV range), as well as combinations of these approaches, including low power high voltage discharge circuits combined with lower voltage power supplies.

APPARATUS EXAMPLE 1

Jet Construction, Holes

Single or multiple jets with exit holes were typically 0.02–0.04 inches in diameter. Each jet exits from a small hole in the end of a tubular assembly which includes an electrical gap near the hole. Needle jet construction:

FIG. 1 is a diagrammatic representation of high speed injection means (1) inserted into a reaction chamber (16). As shown in FIG. 1 and FIG. 1*a*, a high dielectric insulating tube (2) comprises the body of the jet. The jet itself has a front hole or port (10) where the jet enters the reaction chamber (16) (or is in fluid contact with the reaction chamber). Within the high dielectric insulating tube (2) is a high voltage electrode. In FIG. 1 this high voltage electrode is (6) and is in tubular form, but in FIG. 1a the electrode is (22) in the shape of a wire. In both FIGS. 1 and 1a the high voltage electrode extends toward, but not fully to, the front of the jet, that is the end closer to the reaction chamber. Flow path (14) comprises the interior of tubular electrode (6) or the surrounding of wire electrode (22). At the front of the dielectric insulating tube and extending back over said tube is a ground return shield and electrode (4). The flow path (14) leads into an aperture (8) termed the "electric discharge volume" which leads in turn through port (10) into the reaction chamber. The internal electrode (6) or (22) is in fluid connection between the jet gas inlet (12) and the reaction chamber (16) which contains the subject fluid. High speed gas velocity is provided by blower (13). The space between the end of the high voltage electrode (6) or (22) and the front of the jet comprises the electric discharge volume (8). Emerging from port (10) into reaction chamber (16) is a stream of activated species (17) which, in particular embodiments, is accompanied by UV light.

In the depicted embodiment of FIG. 1, high dielectric insulating tube (2) is glass with a 6 mm OD, 2 mm ID and is 15 cm long. Tube (2) was contained within a electrode (4), a close fitting stainless steel jacket. The stainless steel jacket (4) was closed at the front end except for a central jet exit aperture port (10), 1 mm in diameter. A stainless steel tubular electrode (6) was located inside the bore of the ceramic, leaving a 2 mm gap at forming electric discharge volume (8) between the end of the electrode (6) and the jet exit hole in the jacket (10). The internal volume of the jet structure containing the discharge volume was constructed to minimize the possibility of electric discharge along the internal surface of the apparatus rather than through the gas. The structure also augments exposure of the flowing gas to the discharge immediately before exiting the jet. The working gas inlet for the jet entered the jet (14) at the end (12) away from the reaction chamber (16). Electrical connections (18 and 20) were powered from an electrical energy source (19) and were made to the stainless steel jacket (4) and to the central electrode (6) where it emerged from the central bore (14).

The apparatus of FIGS. 1 and 1a is operated at a variety f power levels including 60 Hz AC. Under such conditions, the jets shown in FIGS. 1 and 1a exhibit self-switching discharge. Self-switching discharge arises by the application to the jet of high voltage, here AC at 60 Hz. High voltage will be understood to mean voltages from about 10 Hz to about 30 kHz. The resulting electric discharge between (8) and (10) in FIG. 1 or between (22) and (10) in FIG. 1a self-switches on and off at typically 15–30 kHz, with the actual switching frequency dependent on the applied voltage, electric circuit parameters, gas temperature, flow conditions, and gas composition. The 60 Hz applied voltage approximates DC relative to the self switching frequency, and applied DC high voltage is expected to result in similar switching behavior. Self-switching discharge behavior has been observed to date at applied frequencies of high voltage power between 10 Hz and 30 kHz. The self switching behavior is not present in the absence of jet gas flow. A practitioner in the art will understand that the presence or absence of self switching is determinable by measuring the current wave at the high voltage electrode, with an on-off reading being determinative of self switching.

EXAMPLE 2

Jet Injection: N•

The characteristic deactivation (recombination) time of atomic nitrogen to molecular nitrogen in near ambient temperature air is approximately 1 to 5 milliseconds (starting with 1000 ppm N). If the atomic nitrogen is generated 1 mm up stream of a jet exit aperture and the velocity is 100 m/second, less than 1% of the atomic nitrogen will be deactivated before injection. After injection, mixing of the atomic nitrogen bearing jet and the subject fluid (including NO) must take place within about 1 to 5 milliseconds to efficiently achieve chemical reduction of NO in the subject fluid. The reaction of atomic nitrogen with NO in combustion exhaust is typically from 10 to 1,000 times faster than the recombination of atomic nitrogen to molecular nitrogen (depending on the temperature and relative concentrations), so efficient mixing is a strong determinant of process efficacy. Thus, a useful N chemical reduction reactor is designed for jet penetration and mixing of approximately 10 cm into the subject fluid from the jet exit aperture.

EXAMPLE 2

Jet Injection Construction

Figure 2:
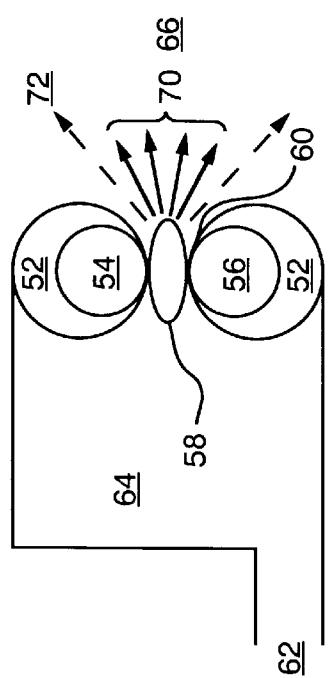
FIG. 2 is an enlarged cross-sectional side view of a slit style apparatus for high speed injection of activated species.

An example of slit jet construction is shown in FIGS. 2 and 2a. FIG. 2 is a cutaway side view of an injection, and FIG. 2a is an outside view looking at the gas jet output aperture. Gas enters a plenum (64) through an entry port (62) leading from a high speed blower (not shown). The activated species jet (70) exits through a slot-shaped aperture (60) into the subject fluid environment (66). The electric discharge volume (58) of the jet, that is the space where activated species is created, is located between two electrodes (54 and 56) are separated from this aperture by high dielectric barriers such as walls or tubes (52) and constitute the slot-shaped jet aperture (60). In other embodiments these electrodes directly bound and constitute the slot-shaped jet aperture (60). Of particular note in the slot-type jet design is that in addition to the activated species jet (70) itself, ultraviolet light (72) from the excitation plasma is unobstructedly impinging upon the subject fluid. In FIG. 2a the ends of the electrodes (54 and 56) are in electrical connection with a power source (53). There is no fundamental restriction on the length of the electrodes.

EXAMPLE 3

Jet Injection Construction, Arrays

Figure 3:
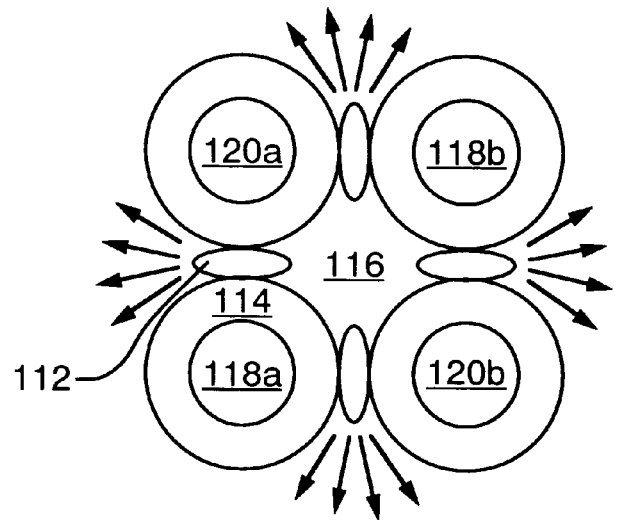
FIG. 3 is an end view of an array of curved slit style jets for high speed injection.

FIG. 3 is a cutaway end on view of one design approach to building arrays of the slot type jets depicted in FIGS. 2 and 2a. In FIG. 3 an assembly of four electrodes (118a and b and 120a and b) are arranged with alternating polarities. In this embodiment, the electrodes are contained within high dielectric shells (114). There are four equivalent electric discharge volumes (112), and the dielectric shells themselves form a central plenum (116) for the inlet gas supply. The inlet gas connection is not shown. Assemblies of numerous slot-jets are also useful using this alternating electrode form.

EXAMPLE 4

Jet Construction, Curved Slot-Type Jet Arrays

Figure 4:
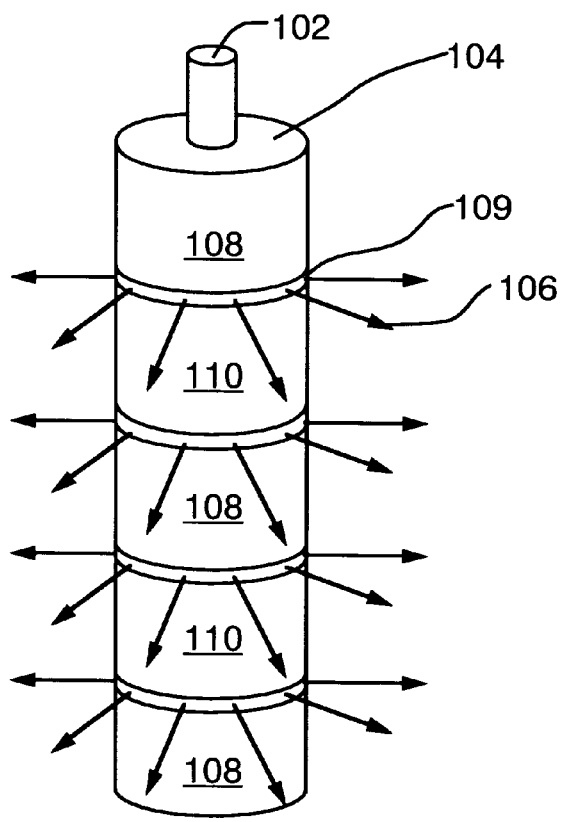
FIG. 4 is a side view of a stacked array of curved slit style jets for high speed injection.

FIG. 4 shows a variation of the slot-type jets depicted in FIGS. 2 and 2a, but employing curved slots rather than straight slots. In FIG. 4, the slots (109) are circumferential with jets (106) emerging outwardly in a ring. Variations on this design include a cylindrical structure with jets emerging inward radially in a ring, mixing with the subject fluid in a tube or pipe.

Figure 11:
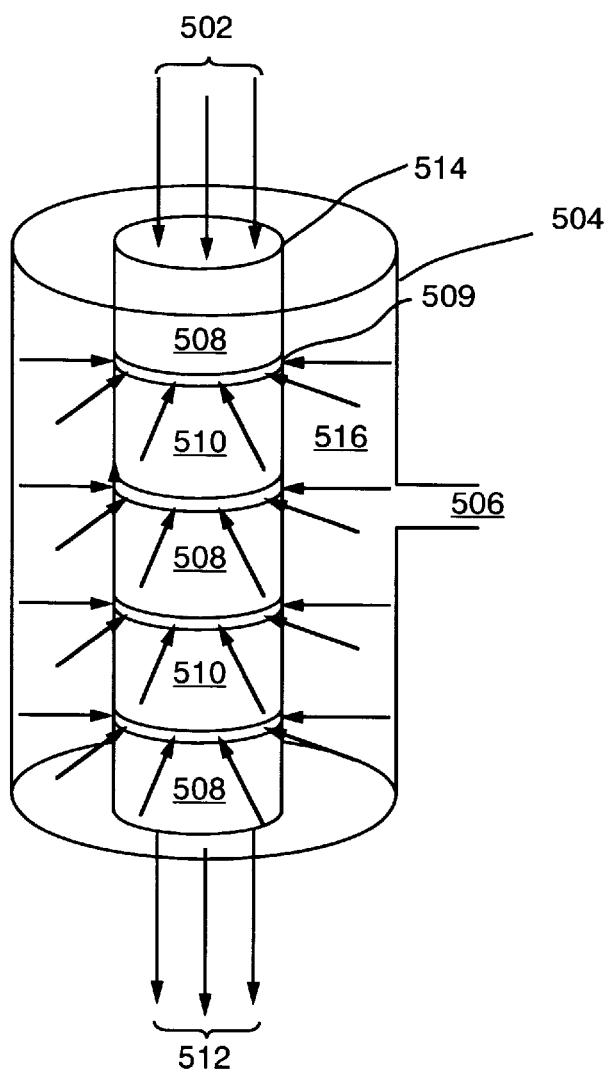
FIG. 11 is another diagrammatic representation of an apparatus for activated species injection for treatment of liquids, suspensions, slurries or solids in liquids.

FIG. 11 shows jets emerging inward radially in a ring, mixing with the subject fluid in a tube or pipe. The subject fluid (502) enters the apparatus at the top and flows through an inner pipe (514) to an exit (512). Jets of activated species (506) enter an pressurize an annulus (516) between the inner enclosure composed of alternate polarity electrodes (508 and 510) and an outer enclosure pipe (504). Annular jets are also be constructed in a similar manner. In FIG. 4, gas enters the 10 plenum (104) through a port (102) at one end of the assembly. The jet slots (109) separate electrodes of alternating polarity (108 and 110), allowing multiple jets to be built into a single cylindrical structure.

APPARATUS EXAMPLE 5

Figure 5:
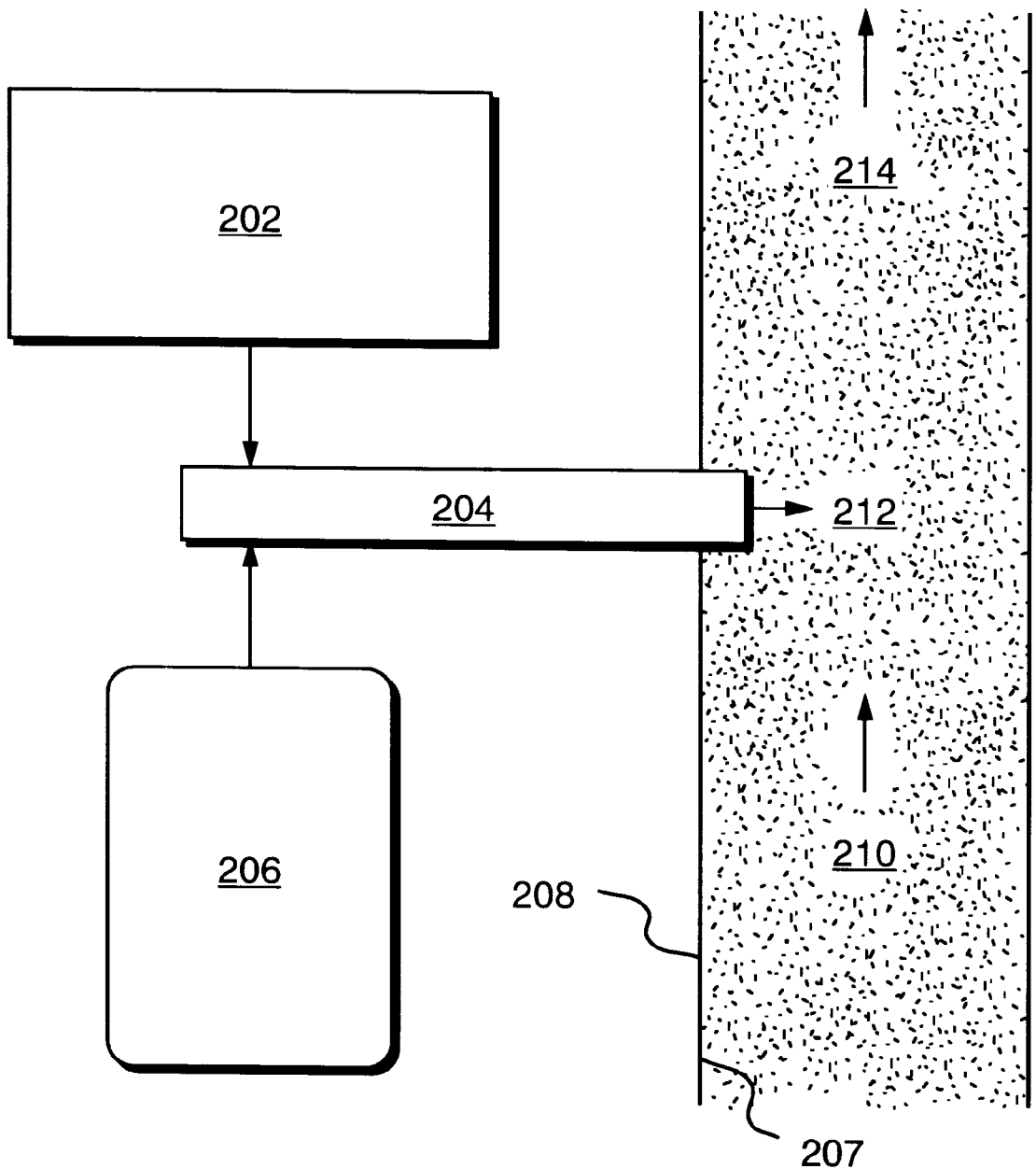
FIG. 5 is a diagrammatic representation of an apparatus for activated species injection for treatment of fluids (liquid or gas) carrying particulates or droplets of liquid.

FIG. 5 is a schematic representation of an apparatus for the treatment of subject fluid jet injection of activated species. Jet injector (204) is supplied with high speed gas for activation (206) and energizing power from power source (202). Suitable power sources include an electric discharge or electron beam source. Activated species jets are entered into the subject fluid (212) in a reactor (208) which is filled with subject fluid (static or flowing), In a flowing embodiment flow is from an entrance (210) to an exit (214) through a reaction zone (212). Subject fluid is variously gaseous, liquid, or suspensions, and include solid particulates. FIG. 5 is representative of the apparatus used to study $NO_x$ chemical reduction and oxidation, and used with a static charge of subject fluid. FIG. 5 also represents the apparatus used to establish the ability of the injectors to perform bleaching of dyes and of paper pulp.

APPARATUS EXAMPLE 6

Figure 6:
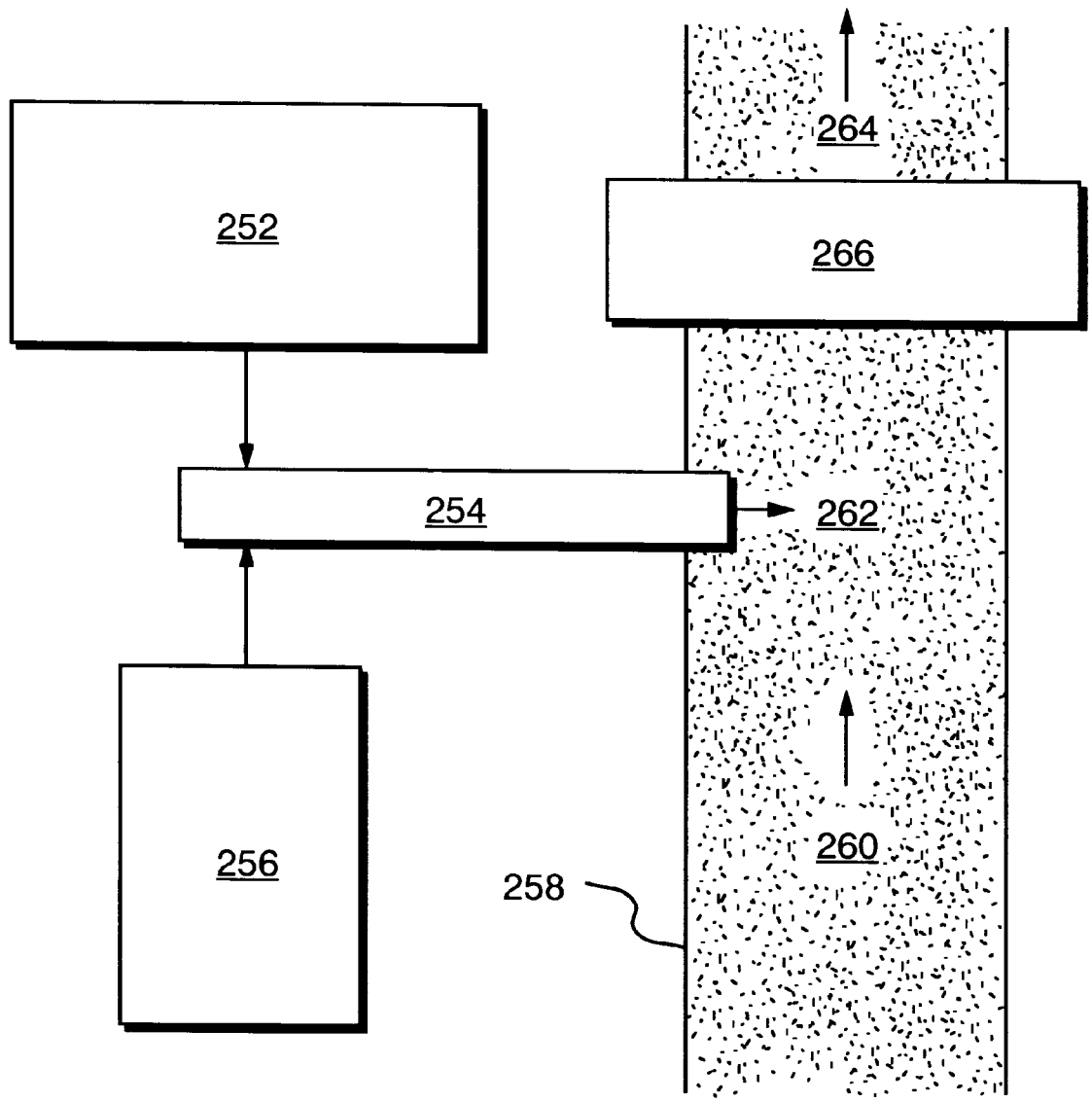
FIG. 6 is a diagrammatic representation of an apparatus for activated species injection for treatment of fluids (liquid or gas) carrying particulates or droplets of liquid, wherein after-treatment is provided.

FIG. 6. is a schematic representation of an apparatus for the treatment of subject fluid using jet injection of activated species, and including an after treatment scrubber. Jet injector (254) is supplied with high speed gas (256) and energizing power (252) suitable for an electric discharge or an electron beam source. Activated species jets are injected into the subject fluid (262) in a reactor (258) has the subject fluid flowing from an entrance (260) to an exit (264) through a reaction zone (262) followed by an after treatment scrubber (266). The scrubber encompasses any suitable means to remove products generated in the reaction zone (262), e.g. chemical scrubbing, filtration, condensation.

APPARATUS EXAMPLE 7

FIG. 7 is a schematic representation of an apparatus for treatment of subject fluid using multiple jet injection. In this embodiment, each jet prepares an independent activated species. This embodiment also contemplates the interaction of two or more injected jets. Jet injectors (303 and 304) are supplied with high speed gas (305 and 306, respectively) and energizing power (301 and 302, respectively) which is suitable for electric discharge or an electron beam source. Activated species jets are injected into the reaction zone which includes a subject fluid or carrier gas (310) entering the reactor (308). The products of the reactions in the reaction zone (312) leave the reactor (308) through an outlet (314). By positioning the jets in the reactor, sequential reactions may be controlled. FIG. 7 also represents one means of installing multiple jets of a single type into a reactor.

APPARATUS EXAMPLE 8

FIG. 8 is a schematic representation of an apparatus for the treatment of solid or liquid surfaces, or for the enhancement or activation of catalytic surfaces. Jet injector (354) is supplied with high speed gas (356) and energizing power (352) which is suitable for an electric discharge or an electron beam source. Activated species are injected into a reactor (358) which contains subject fluid (static or flowing). Flow is from an entrance (360) to an exit (364), through a reaction zone (362) which includes a solid or liquid target surface (366). The activated species in the jet chemically reacts directly with the target surface to provide a reagent source for catalytic reactions at the surface, or to activate the surface for catalytic action.

APPARATUS EXAMPLE 9

Figure 9:
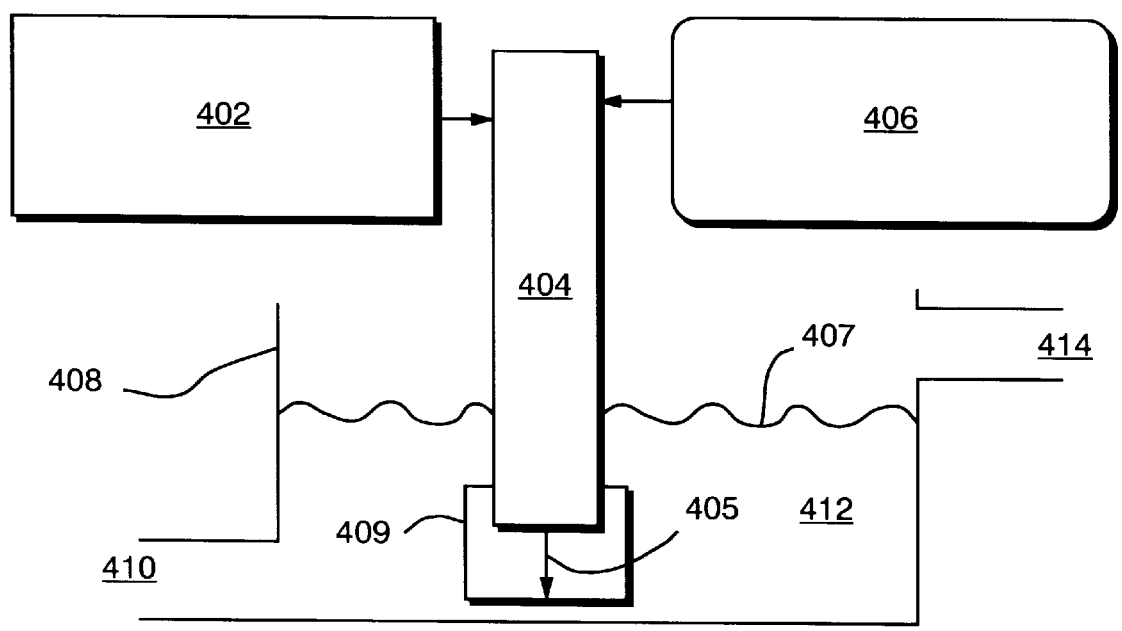
FIG. 9 is a diagrammatic representation of an apparatus for activated species injection for treatment of liquids, suspensions, slurries or solids in liquids.

FIG. 9 is a schematic representation of an apparatus for the treatment of subject fluid as liquids, suspensions, or slurries. Jet injector (404) is supplied with high speed gas (406) and energizing power (402) which is suitable for an electric discharge or an electron beam source. Activated species jets are injected through an opening (405) into a reactor (408) which contains subject fluid (static or flowing) (412) at a point below the surface (407) of the liquid. Flow is from an entrance (410) to rib exit (414). FIG. 9 is representative of laboratory experiments demonstrating bleaching of dye and dyed paper pulp in water slurry.

In practice, entry of subject fluid into the jet is to be avoided. Various means are useful to avoid such entry. In one embodiment, a positive pressure differential sufficient to keep out subject fluid is maintained at all times across opening (405). In another embodiment, the surface level (407) of subject fluid is dropped below the level of opening (405), or alternatively, opening (405) is raised above level (407). In one embodiment, closure means (409) sealingly occludes opening (405). Closure means (409) is variously a plug or valve or a closeable diaphragm.

Methodology

Biocidal action is obtained in the present invention via electric discharge jets of activated species (typically, but not exclusively oxygen, air, or nitrogen) by injection of such activated species into a liquid or gas. By way of example, biocidal action is useful for ventilation air entering an operating suite, or for air exhaust from a hospital room or laboratory where an airborne pathogen (e.g., mycobacterium, bacterium, virus, prion etc) is potentially present In addition, as with bleaching, bubbling activated species through a liquid or slurry reduce or eliminate pathogens and retard proliferation. Activated species contact and destroy the pathogen.

In addition to pathogens, this invention is useful in eliminating organisms such as algae (often a problem in cooling systems) or organisms that are objectionable for such reasons as their odor production, and which are not strictly pathogens.

In particular embodiments of this invention, enhancement or creation of a heterogeneous catalytic surface, or the creation of a more reactive surface is contemplated. An activated species jet is used to deliver activated species to a solid or liquid surface, suspension, or aerosol. By this method the active species enhances the catalytic properties of the surface, or provides the energy to induce chemical reactions at or near the surface. This embodiment is particularly useful in automotive catalytic converters, polymerization initiators, enzyme enhancement, surface cleaning for electronic components and optics, and semiconductor doping. Another embodiment of the present invention is directed to gas phase chemistry. One or more jets of activated species are introduced into a gas phase to cause chemical reactions to occur which otherwise would not occur would be unacceptably slow. The non-thermal distribution of active species allows such highly reactive species to interact at low temperatures including those below the threshold of activation. In particular reactions this is near or below about 20° to 25° C. (room temperature).

In one example, activated species in the form of hydroxyl radicals are produced from one or more jets supplied with water vapor. The hydroxyl radicals are mixed with a gas phase in conjunction with desired reactants such as hydrocarbon molecules as introduced to the gas phase through a second jet. This apparatus and process is particularly useful in chemical syntheses (particularly at reduced temperatures), destruction of volatile organic compounds, and control of polymerization reactions.

In a particular embodiment, the present invention is useful as an electrochemical couple as part of an electrochemical or electrolytic cell. This is similar to use of a hydrogen electrode used as an electrochemical standard, but with the bubbled gaseous activates species generated in the present instance by the discharge in the jet. The reactions of the active species at the liquid or solid surface of a cell are measured by standard electrochemical techniques, new analytical regimes and new chemical reactions could become accessible in this manner.

As an example of this embodiment, a standard hydrogen or other reference half-cell is prepared, and another half-cell of an electrochemical cells prepared using an electrically shielded jet. The electrode potentials are then measured to determine the ionic character of the jet species. This process and apparatus is particularly useful in analytical instrumentation, and chemical synthesis.

EXAMPLE 10

Chemical reduction in an NO spiked airstream using active nitrogen jets

The present invention has the ability to chemically react NO in the presence of oxygen in air, including chemical reduction of NO to nitrogen. In a reactor substantially as shown in FIG. 5, three nitrogen jets such as (204) were inserted through and mounted to the walls (207) of a Teflon® (polytetrafluoroethylene) line flow test reactor (208) of cross section 2.5×4 inches. The room air to be tested flowed vertically through the reactor (208) while the jets were injected at right angles to the test gas flow (arrow). NO was injected into the test gas upstream of the test reactor. $NO_x$ concentrations were measured throughout the testing using chemiluminescence type $NO_x$ analyzers (Series 10, ThermoElectron, Waltham, Mass.).

The 3 nitrogen jets of this experiment were operated at 44 scfh nitrogen flow, and 1.7 scfm total flow in the reaction chamber. The gas stream tested: 12% $O_2$ (air, diluted with nitrogen gas), and spiked with NO upstream of the test. The test was run at temperature 80° F. Total electrical power dissipated in jets when discharge running was 24 watts. Measured $NO_x$ concentrations:

Electric discharge power OFF: 28 ppm NO, 4 ppm NO2, 1 ppm HNO3

Electric discharge power ON: 0.5 ppm NO, 4 ppm NO2, 9 ppm HNO3

The NO decreased from 28 to 0.5 ppm when power was applied. Thus, at least 98% reaction of NO was achieved. The total $NO_x$ (NO+NO2+HNO3) decreased from 33 ppm to 13.5 ppm demonstrating a 59% reduction in total $NO_x$ by chemical reduction.

EXAMPLE 11

Chemical reduction in a combustion exhaust using active nitrogen jets

This test demonstrated the ability of the jet injection technique to react with NO in combustion exhaust gas including the ability to chemically reduce NO to nitrogen gas. As in FIG. 5, with the exception that three jets were inserted through and mounted to the walls of a Teflon® flow test reactor (208) of cross section 2.5×4 inches.

The combustion gas to be tested was generated in a natural gas fired burner and flowed vertically through the reactor in direction of flow (210) while the jets were injected at right angles to the test gas flow. NO was also injected into the test gas upstream of the test reactor. $NO_x$ concentrations were measured throughout the testing using chemiluminescence type $NO_x$ analyzers. The apparatus comprised 3 nitrogen jets with 44 scfh nitrogen flow, and 1.5 scfm total flow in the reaction chamber. The gas stream had 1.8% O2 bearing combustion exhaust and was at 400° F. Total electrical power dissipated in jets was 37 W when discharge running.

Measured $NO_x$ concentrations:

Electric discharge power OFF: 59 ppm NO, 3 ppm NO2, 0 ppm HNO3

Electric discharge power ON: 12 ppm NO, 15 ppm NO2, 8 ppm HNO3

The NO decrease from 59 to 12 ppm when power was applied. This was an 80% reaction of NO. The total $NO_x$ (NO+NO2+HNO3) decreased from 62 ppm to 35 ppm demonstrating a 44% reduction in total $NO_x$ by chemical reduction, the conversion of NO to NO2 or to HNO3

EXAMPLE 12

Chemical oxidation in an $SO_2$ bearing combustion exhaust using active air and nitrogen jets This test demonstrated the ability of the jet injection technique to oxidize NO in combustion exhaust gas including the ability to perform this reaction in the presence of sulfur dioxide. As shown in FIG. 5, except that 8 nitrogen jets (204) were inserted through and mounted to the walls of a Teflon® (PTFE) flow test reactor (208) of cross section 2.5×4 inches.

The combustion gas to be tested was generated in a propane gas fired burner and flowed vertically through the reactor (208) while the jets (204) were injected at right angles to the test gas flow. NO was also injected into the test gas upstream of the test reactor. $NO_x$ concentrations were measured throughout the testing using chemiluminescence type $NO_x$ analyzers (Series 10, ThermoElectron, Waltham, Mass.). $SO_2$ concentrations were measured using an ultraviolet fluorescence type $SO_2$ analyzer. The presence or absence of 3000 ppm $SO_2$ had no measurable effect on the experimental measurements, and no change was measured in the $SO_2$ concentration as arising from the operation of the discharge jets. Test conditions included 8 nitrogen jets with 107 scfh air or nitrogen flow, 3.2 scfm total flow in the reaction chamber.

The gas stream tested was 5% $O_2$ bearing combustion exhaust at 80° F., with 75 W total electrical power dissipated in jets when discharge running.

Measured $NO_x$ concentrations (using air in the injection jets):

Electric discharge power OFF: 40 ppm NO, 38 ppm NO2, 2 ppm HNO3

Electric discharge power ON: 0 ppm NO, 26 ppm NO2, 99 ppm HNO3

Measured $NO_x$ concentrations (using nitrogen in the injection jets):

Electric discharge power OFF: 36 ppm NO, 36 ppm NO2, 4 ppm HNO3

Electric discharge power ON: 0 ppm NO, 4 ppm NO2, 36 ppm HNO3.

Complete reaction of NO was achieved in these tests. With air jets most of the chemical reaction of NO was oxidation to HNO3. The total $NO_x$ (NO+NO2+HNO3) increased when air jets were used, likely due to $NO_x$ generation by the electric discharge in the air jets. The reduction in total $NO_x$ achieved in the nitrogen jet test demonstrates that chemical reduction of NO can be achieved in a gas stream containing up to 3000 ppm $SO_2$.

EXAMPLE 13

Bleaching of dye and of paper pulp suspended in water Activated oxygen jets

Figure 10:
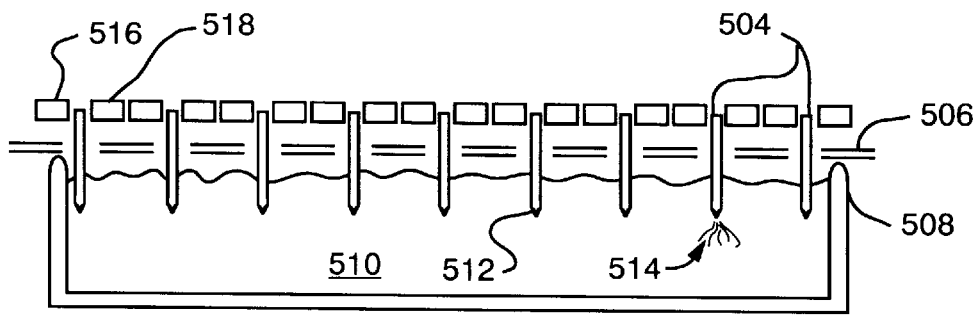
FIG. 10 is another diagrammatic representation of an apparatus for activated species injection for treatment of liquids, suspensions, slurries or solids in liquids.

In an apparatus as shown in FIG. 10, an array of nine jets (504), was mounted in a flat plate (506). The plate was mounted atop a vessel (508) containing approximately 1 liter of an aqueous slurry of paper pulp (510) dyed black (Number 15, RIT Dye/CPC Specialty Products, Indianapolis, Ind.)). The jet tips (512) were immersed in the slurry so that the emerging jets of gas (514) provided agitation of the mixture as well as active species from the discharge of the jets. The jets were operated with oxygen from an oxygen tank (516) at approximately 5 scfh/jet, and from a high voltage power source (518). After two hours of introduction of activated O• introduction from approximately 8 watts applied to the jet discharge, the black dyed paper pulp had lightened to a light gray. Samples of the pulp were dried and the treated and untreated papers compared to positively confirm the bleaching effect. As a control, an identical vessel of dyed paper pulp was subjected to bubbled oxygen from the same jets for identical time, but without electrical power being applied to the oxygen stream. This resulted in no apparent bleaching of the paper pulp.

EXAMPLE 14

Bleaching of dye solutions Activated oxygen jets

In an apparatus similar to that of FIG. 10, but with only a single jet, the jet (512) was immersed in 100 cc of water made opaque with black cloth dye (RIT Number 15). The jet tip was immersed in the dye solution so that the emerging jets of gas (514) at a flow rate of 5 scfh at approximately 80° F. provided agitation of the mixture as well as active species from the discharge of the jets. The jets were operated with oxygen from an oxygen tank After 30 minutes of introduction of activated O• introduction from approximately 10 watts applied to the discharge, the black dyed lightened to a transparent yellow-brown color.

In other bleaching applications such as those bleaching cloth, activated species can be introduced into the washing tank of a washing machine.

We claim:

1. A method of delivery of exogenous non-thermal plasma activated species to a subject fluid comprising (a) creating the activated species in an energizing means; and, (b) introducing at least about 10% of said activated species into a subject fluid by high speed injection means in less than about 10 milliseconds wherein said subject fluid is at least about at atmospheric pressure.

2. A method of delivery of exogenous non-thermal plasma activated species to a subject fluid comprising (a) creating the activated species in an energizing means; and, (b) introducing said activated species into a subject in less than about 10 milliseconds fluid by high speed injection means wherein said subject fluid is at least about at atmospheric pressure.

3. The method of claim 2 wherein said introducing is in less than about 1 millisecond.

4. A method of delivery of exogenous non-thermal plasma activated species to a subject fluid comprising (a) creating the activated species in an energizing means; and, (b) introducing said activated species into a subject fluid by high speed injection means wherein said subject fluid is at least about at atmospheric pressure and wherein said introducing is at an operating pressure differential above the subject fluid of from about 5 to about 50 psid.

5. The method of claim 4 wherein said operating pressure differential is at least about 15 psid.

6. A method of delivery of exogenous non-thermal plasma activated species to a subject fluid comprising (a) creating the activated species in an energizing means; and, (b) introducing at a temperature of up to about 600° C. said activated species into a subject fluid by high speed injection means wherein said subject fluid is at least about at atmospheric pressure.

7. The method of claim 6 wherein said temperature is from about less than about 100° C.

8. A method of delivery of exogenous non-thermal plasma activated species to a subject fluid comprising (a) creating the activated species in an energizing means; and, (b) introducing at from about 10 to about 400 meters/second said activated species into a subject fluid by high speed injection means wherein said subject fluid is at least about at atmospheric pressure.

9. The method of claim 8 wherein said introducing is at least about 100 meters/second.

* * * * *